United States Patent [19]

Hack

[11] Patent Number: 4,920,363
[45] Date of Patent: Apr. 24, 1990

[54] METHOD OF MANUFACTURING ELECTROSTATIC PRINTER HEADS

[75] Inventor: James R. Hack, Villa Park, Calif.

[73] Assignee: Calcomp Inc., Anaheim, Calif.

[21] Appl. No.: 293,823

[22] Filed: Jan. 4, 1989

[51] Int. Cl.$^5$ .............................. G01D 15/00
[52] U.S. Cl. .................... 346/155; 346/150
[58] Field of Search ............ 346/155, 139 C, 1.1, 346/150, 153.1

[56] References Cited

U.S. PATENT DOCUMENTS 4,415,403 11/1983 Bakewell ..................... 346/155

Primary Examiner—Arthur G. Evans
Attorney, Agent, or Firm—Donald A. Streck; William F. Porter, Jr.

[57] ABSTRACT

The method of manufacturing an electrostatic printhead or the like. Conductive surfaces are applied to both sides of an insulating substrate. Unneeded portions of the conductive surface are etched away by a photolithographic process to form conductive layers in patterns of parallel, spaced, printwire traces and connective conductors with ends of the printwire traces terminating in a common plane defining a printface of the printhead. Additional conductive material is added to the printwire traces by an additive plating process to give them a substantially square cross-section. The edge is laser trimmed to form the print face. Insulative layers are added over both sides with vias located over the connective conductors at places where electrical connection is to take place. A plurality of conductive busses are then formed on the insulative layers crossing over the connective conductors and vias with conductive material formed in the vias to make the desired electrical connections between the connective conductors and the busses.

2 Claims, 3 Drawing Sheets

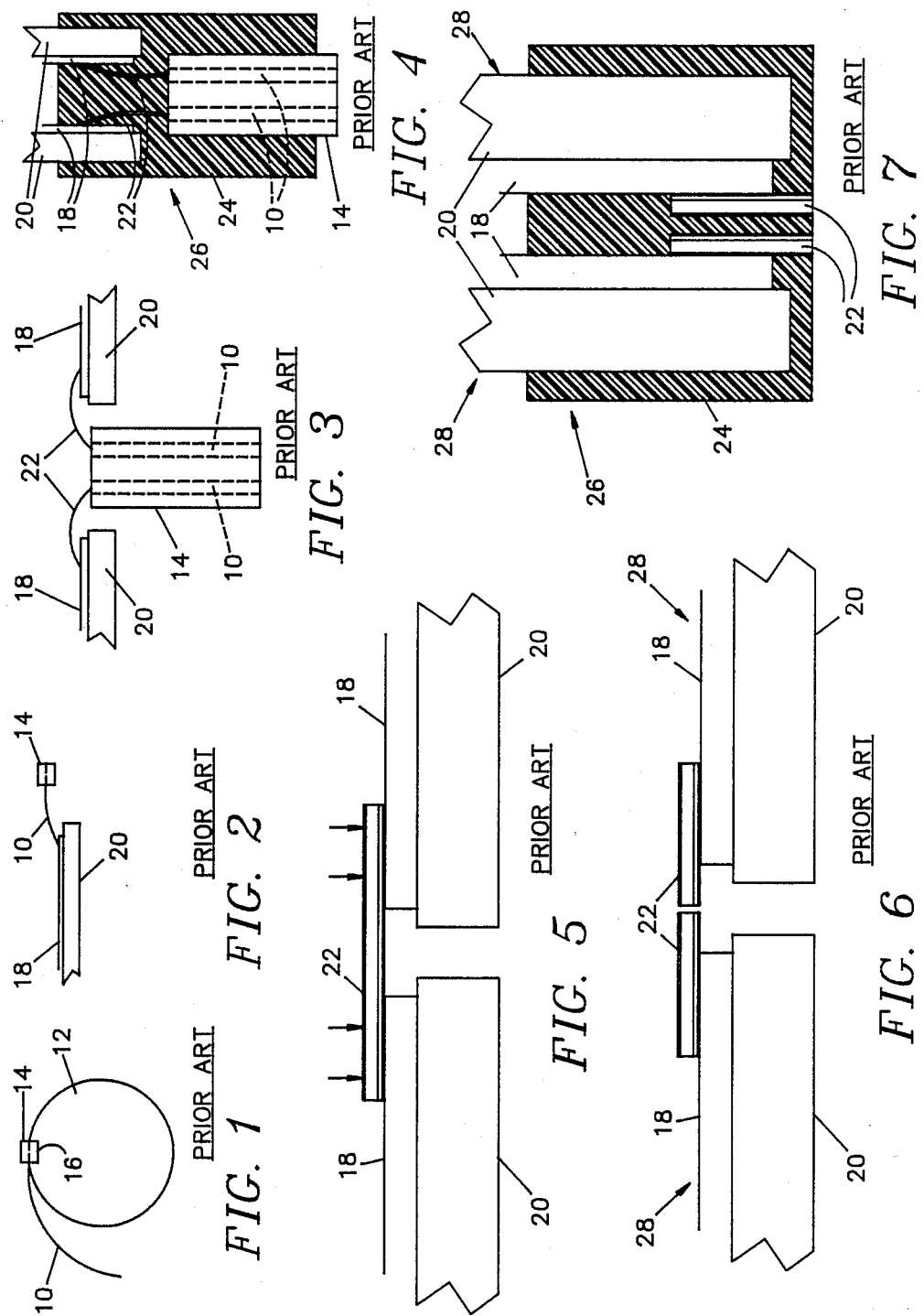

“METHOD OF MANUFACTURING
ELECTROSTATIC PRINTER HEADS

BACKGROUND OF THE INVENTION

The present invention relates to methods of manufacturing printheads as employed in electrostatic printers, and the like, and, more particularly, to the method of manufacturing an electrostatic printhead or the like of the present invention comprising the steps of, forming a pattern of parallel, spaced, first printwire traces and connective conductors on one side of an insulative substrate (primarily epoxy glass or equivalent) with ends of the first printwire traces terminating in a common plane defining a printface of the printhead; adding additional conductive material to the first printwire traces adjacent the common plane to give them a substantially square cross-section; forming a pattern of parallel, spaced, second printwire traces and connective conductors on a second side of the insulative substrate with ends of the second printwire traces terminating in the common plane defining the printface of the printhead; and, adding additional conductive material to the second printwire traces adjacent the common plane to give them a substantially square cross-section. Even more specifically, it relates to the above method and additionally comprising the steps of, applying a first insulating layer over a portion of the first connective conductors with first vias in the first insulating layer positioned on the first connective conductors where electrical connection is to be made thereto; forming a plurality of first conductive busses on the insulating layer and crossing the first connective conductors and the first vias including causing a conductive material to be formed in the first vias between the first connective conductors and the first conductive busses to cause electrical connection therebetween; applying a second insulating layer over a portion of the second connective conductors with second vias in the second insulating layer positioned on the second connective conductors where electrical connection is to be made thereto; and, forming a plurality of second conductive busses on the insulating layer and crossing the second connective conductors and the second vias including causing a conductive material to be formed in the second vias between the second connective conductors and the second conductive busses to cause electical connection therebetween.

Electrostatic printheads, and the like, as manufactured by prior art techniques tend to be very expensive because of the labor intensive nature of the process. In this regard, for a more detailed discussion of the prior art in the manufacture of such printheads, attention is directed to U.S. Pat. No. 4766448 entitled Electrostatic Printhead Method and Apparatus by James Hack et al. and co-pending application Ser. No. 170,439, filed 21 Mar. 1988 by David T. Beegan entitled Electrostatic Printhead and Method of Manufacture, both of which are owned by the common assignee of this application.

A typical electrostatic printhead comprises two closely spaced rows of wires which are penpendicular to the printing face of the printhead where they terminate. The wires of one row are offset half the distance between the wires in the adjacent row. This results in much closer spacing between adjacent print positions than would be possible with all the wires on one row. The closer the spacing, of course, the better the quality of the printed material that is produced. Each typical printhead contains literally tens of thousands of wires.

Most printheads to date have been produced by hand wiring techniques. As depicted in FIG. 1, wire 10 is wound around a cylindrical mandrel 12. The printhead body 14 is formed by molding a resin material, or the like, about the wires 10 in a slot 16 provided in the mandrel for the purpose. As depicted in FIG. 1, the wires 10 are then cut along one face of the printhead body 14. That face becomes the printing face. The wires 10 extend from the other or back face. As depicted in FIG. 2, the most common assembly technique to date is to have the wires 10 hand soldered to the conductors 18 on a printed circuit board 20. Because of the labor intensive nature of such a process, it has been accomplished as a "cottage industry" in locations where labor is less costly in order to keep the cost of manufacture within reasonable limits.

As the requirements for electrostatic printheads have increased, the ability to meet the needs in a cottage industry environment has not kept pace with the demand. Accordingly, there has been considerable interest in developing a method of manufacture which eliminates the hand soldering step and replaces it with a reliable, mechanized alternative. One approach as disclosed in the above-referenced Hack et al. patent is as shown in FIGS. 3 and 4. In that approach, the printhead body 14 is formed according to the technique of FIG. 1. The wires 10, however, are cut from both faces. The exposed ends of the wires 10 on the back face of the printhead body 14 are then joined to the conductors 18 of a pair of printed circuit boards 20 by wire bonding wires 22. The printed circuit boards 20 are then folded towards one another and bonded to the printhead body 14 with a "potting" material 24, or the like, to form a unitary printhead 26 as depicted in FIG. 4.

The approach of the above-referenced Beegan application is depicted in FIGS. 5-7. As shown in FIG. 5, the conductors 18 of two printed circuit boards 20 placed close adjacent one another with the conductors 18 in end-to-end relationship are joined by wire bonding wires 22 bonded to the conductors 18 as represented by the arrows. The wires 22 are then cut in half as indicated in FIG. 6 to form two half printhead elements 28. As depicted in FIG. 7, the two half printhead elements 28 are then positioned in parallel to one another with the cut ends of the wires 22 in proper alignment to form the print wires and then assembly joined together with potting material 24, or the like, as before, to form a unitary printhead 26 as depicted in FIG. 7.

While both these techniques will work for their intended purpose, the wire bonding equipment to do the specific task does not exist. Likewise, there is no presently available equipment capable of placing, bonding, and cutting the wires 22 as shown in FIG. 6 without bending the wires out of perfect alignment. Because of the size of the wires, spacing, etc. required to produce an acceptable electrostatic printhead, this is a critical limitation to emloying the technique at a commercial level in the near future.

What is needed is a method of manufacturing electrostatic printheads, and the like, which is completely mechanical in nature like the prior art methods of FIGS. 3-7 above; but, which employs assembly apparatus and techniques presently available in the art for manufacture on a commercial basis.

Wherefore, it is the object of the present invention to provide such an immediately implementable method for manufacturing electrostatic printheads according to fully mechanized techniques.

Other objects and benefits of the present invention will become apparent from the description which follows hereinafter when taken in conjunction with the drawing figures which accompany it.

SUMMARY

The foregoing objects have been achieved by the method of manufacturing an electrostatic printhead or the like comprising the steps of, applying a first conductive surface to one side of an insulative substrate; etching away unneeded portions of the first conductive surface to form a conductive layer in a pattern of parallel, spaced, first printwire traces and connective conductors with ends of the first printwire traces terminating in a common plane defining a printface of the printhead; and, adding additional conductive material to the first printwire traces adjacent the common plane to give them a substantially square cross-section. Preferably, there is the additional step of trimming the ends of the first printwire traces and the substrate thereunder along a straight line adjacent the common plane to form the plane of the printface.

In the preferred embodiment, the step of etching away unneeded portions of the first conductive surface comprises etching the first conductive surface employing a photolithographic process and the step of selectively adding additional conductive material to the first printwire traces comprises adding additional conductive material employing an additive plating process.

The preferred method also additionally comprises the steps of, applying a second conductive surface to the other side of the insulative substrate; etching away unneeded portions of the second conductive surface to form a second conductive layer in a pattern of parallel, spaced, second printwire traces with ends of the second printwire traces terminating in the common plane defining the printface of the printhead; and, adding additional conductive material to the second printwire traces to give them a substantially square cross-section as well as trimming the ends of the first and second printwire traces and the substrate thereunder along a straight line to form the plane of the printface.

The preferred embodiment also includes the steps of applying an insulating layer over a portion of the first connective conductors with vias in the insulating layer positioned on the first connective conductors where electrical connection is to be made thereto and forming a plurality of first conductive busses on the insulating layer and crossing the first connective conductors and the vias including causing a conductive material to be formed in the vias between the first connective conductors and the first conductive busses to cause electrical connection therebetween.

A longer printhead can be made by making a pair of the printheads; positioning the pair of printheads side by side in a first common plane with their print faces in a second common plane and with their adjacent first and second printwire traces registered with respect to one another; and, bonding the pair of printheads together to form a single, lengthened, combined printhead. Preferred bonding comprises encasing the pair of printheads in a potting material.

DESCRIPTION OF THE DRAWINGS

FIG. 1 is a simplified drawing showing part of a prior art process for manufacturing electrostatic printheads.

FIG. 2 is a simplified drawing showing how the printhead element produced by the process of FIG. 1 is hand wired to a printed circuit board as part of a prior art process for manufacturing electrostatic printheads.

FIG. 3 is a simplified drawing showing how the printhead element produced by the process of FIG. 1 is connected to a printed circuit board by wire bonding techniques as part of a prior art process for manufacturing electrostatic printheads.

FIG. 4 is a simplified drawing showing how the printhead element produced by the process of FIG. 4 is folded and bonded together into a unitary structure as part of a prior art process for manufacturing electrostatic printheads.

FIG. 5 is a simplified drawing showing a prior art process for manufacturing electrostatic printheads by interconnecting two printed circuit boards with wire bonding wires which then become the printing wires.

FIG. 6 is a simplified drawing showing how the wire bonding wires in FIG. 5 are cut apart to create two printhead elements.

FIG. 7 is a simplified drawing showing how the printhead element produced by the process of FIGS. 5 and 6 are bonded together into a unitary structure as part of a prior art process for manufacturing electrostatic printheads.

DESCRIPTION OF THE PREFERRED EMBODIMENT

The method of manufacture to be described hereinafter is capable of implementation with photolithographic processes and controls presently available and being used on a commercial basis for the production of electonic components on a rigid or semi-rigid substrate such as epoxy glass. The process is one providing in-process inspection capability, modular assembly, less inter-electrode capacitance, less cost, higher production rates, less error, and domestic manufacture capability. High density traces incorporating an additive plating process, or the like, form square, conductive cross-sections (being the printing "nibs") supported by the substrate. All interconnection is done via etched, screened, or deposited traces. A single processed substrate can be used (the preferred approach) thus eliminating a laminating process. Alternatively (and not preferred), two identical processed substrates can be laminated in registration to form the active surface. For convenience only, the description which follows hereinafter is directed to an etching process and will refer to same. As those skilled in the art will appreciate and as mentioned above, screening, deposition, or other methods well known in the printd circuit art can be employed within the scope and spirit of the present invention to form the electrical traces. Accordingly, it is the applicant's intent that the scope to be accorded the present invention and the claims appended hereto be in keeping with the breadth of the disclosure and not be limited by the specific example employed for convenience and simplicity only.

Figure 9:
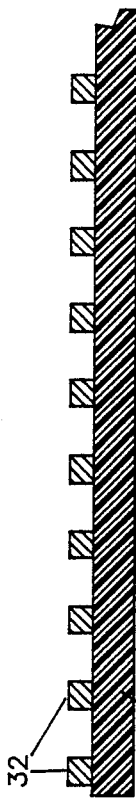
FIG. 9 is a cutaway end view of a printed circuit board in the process of creating an electrostatic printhead according to the method of the present invention with the top "wires" in place.
Figure 8:
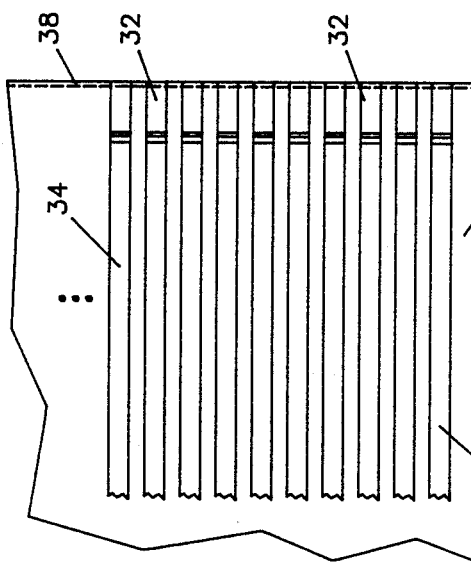
FIG. 8 is a top view of a printed circuit board in the process of creating an electrostatic printhead according to the method of the present invention.
Figure 11:
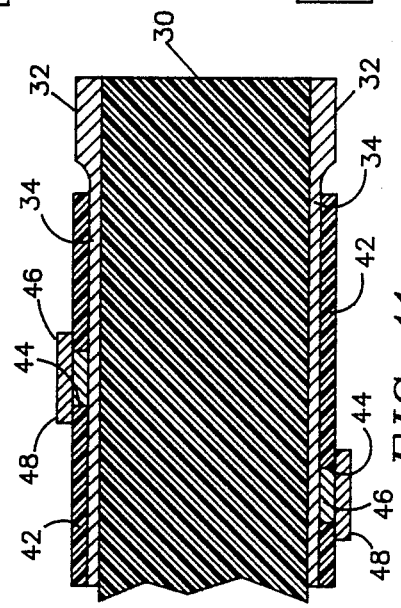
FIG. 11 is a cutaway side view of a printed circuit board of an electrostatic printhead according to the method of the present invention with both the top and bottom "wires" in place and showing how the bottom wires are electrically connected to the associated conductive busses associated with each side of the printed circuit board by plating or connecting through vias.

As depicted in FIG. 8 in simplified form, the basic element of a printhead manufactured according to the present invention is a substrate 30 having built-up print wire nibs 32 and connecting conductive traces 34 extending therefrom. With reference to FIG. 9, the substrate 30 is of an insulative material such as used for printed circuit boards, or the like. Epoxy laminate or polymide would be typical examples of acceptable materials. The only requirement is that the substrate 30 be of a material upon which a conductive surface can be deposited, sputtered, or laminated and then processed according to known techniques to form the required pattern of printwire nibs 32 and traces 34 as depicted in FIG. 8.

Figure 10:
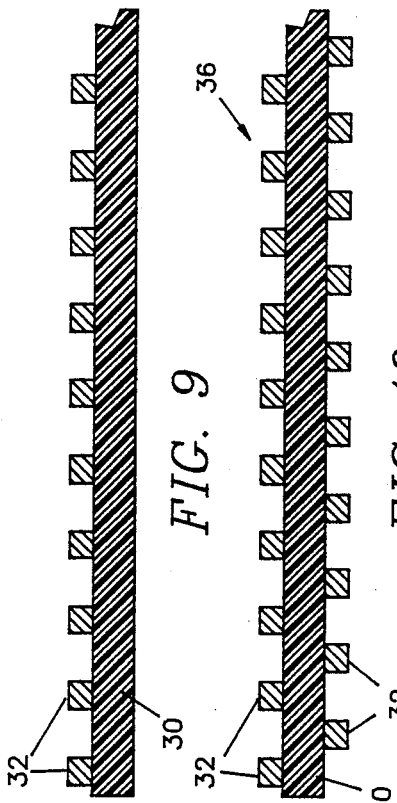
FIG. 10 is a cutaway end view of a printed circuit board in the process of creating an electrostatic printhead according to the method of the present invention with both the top and bottom "wires" in place.
Figure 12:
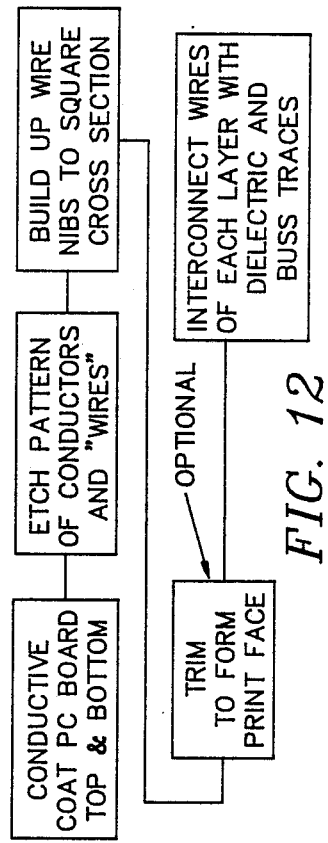
FIG. 12 is a block diagram showing the major steps of the method of the present invention in its preferred embodiment.

In the preferred approach as depicted in FIGS. 9-11 and 13-15 (and shown in block diagram form in FIG. 12), the substrate 30 with an appropriate conductive layer thereon is processed to a desired first layer conductive pattern by a conventional fine-line photolithographic process. In other words, employing techniques well known in the art, a conductive layer is applied (or pre-applied) to the substrate 30 such as by sputtering, or the like. Using photolithographic techniques, the undesired portions of the conductive layer are etched away leaving a first layer of traces 34 and printwire nibs 32 on the surface of the substrate 30. Additional conductive material is then applied to the printwire nibs 32 such as with a selective additive plating process (as is known in the art) to provide a thickness of the printwire nibs 32 which is preferably such as to provide an aspect ratio of approximately 1:1; that is, the printwire nibs 32 (at least adjacent what will be the printface) are preferably of a square cross section. While it would be possible to form two substrates 30 with the printwire nibs 32 and their connective traces 34 on one side as depicted in FIG. 9 and then laminate the two substrates 30 together with the nibs 32 in proper registration, it is preferred that pre-registered nibs 32 be formed on the bottom (or reverse side) of the substrate in the same manner as described above to produce the unitary, basic printhead element 36 as shown in FIG. 10. To assure a perfect printface, it is preferred that the printface be formed by trimming the ends of the printwire nibs 32 and substrate 30 as indicated by the dashed line 38 in FIG. 8. Perfect (and preferred) trimming can be achieved using laser trimming techniques and apparatus well known in the art.

The foregoing approach for producing an electrostatic printhead element is, in and of itself, novel within the art. One could then make the required connections to the conductive traces 34 using hand or machine soldering techniques or by employing wire bonding apparatus to affect the connections. When using the preferred configuration of FIG. 10 it is also preferred to provide multiplexing within the recording cycle and thus reduce the total quantity of electronic switches required. The method of making the connections to multiplexing busses according to the preferred method of the present invention will now be described. In this regard, either of two methods can be employed to accomplish the electrical connections—by employing a plating process of a type well known in the art in vias provided for the purpose or, alternatively, dielectric layering can be combined with screen or pattern plating of the buss interconnects. Such techniques are well known to those skilled in the art and, therefore, in the interest of simplicity and the avoidance of redundancy, they will not be described in any great detail herein.

The preferred method employs the two-sided configuration of FIG. 10 as it permits fabricating the nibs or styli on each side of a single insulative substrate which serves as a calibrated "row-to-row" spacer and simultaneously provides the stylus/buss interconnects. Moreover, (as opposed to the configuration of FIG. 9) this method does not require individual substrates to be laminated in registration with one another with an insulative spacer therebetween to form the two rows of staggered styli. All critical alignment and registration is governed by photolithography, which is well understood by those skilled in the art.

Figure 14:
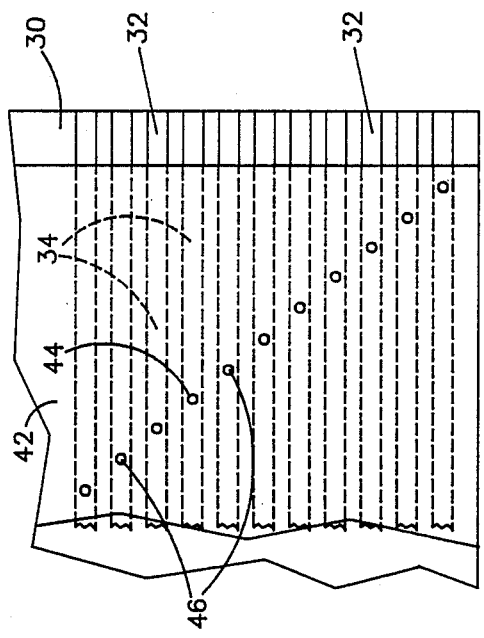
FIG. 14 is a top view of the printed circuit board of FIG. 13 after the step of plating into the holes or vias.
Figure 15:
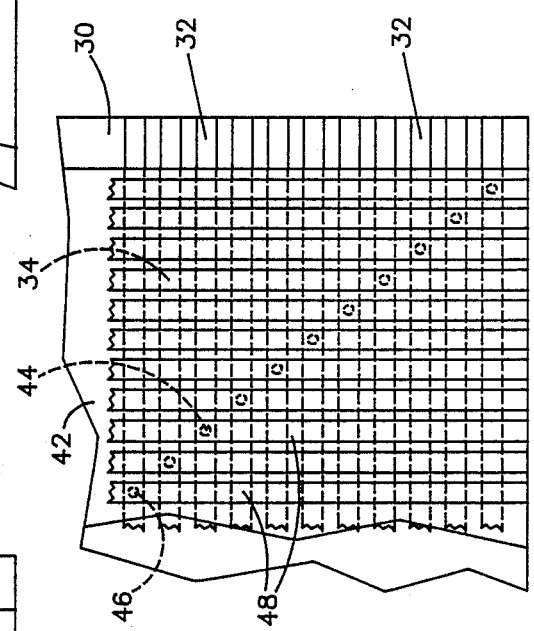
FIG. 15 is a top view of the printed circuit board of FIG. 14 after the step of plating the busses onto the insulative coating with electrical connection into the holes or vias and, thereby, to the wires.
Figure 13:
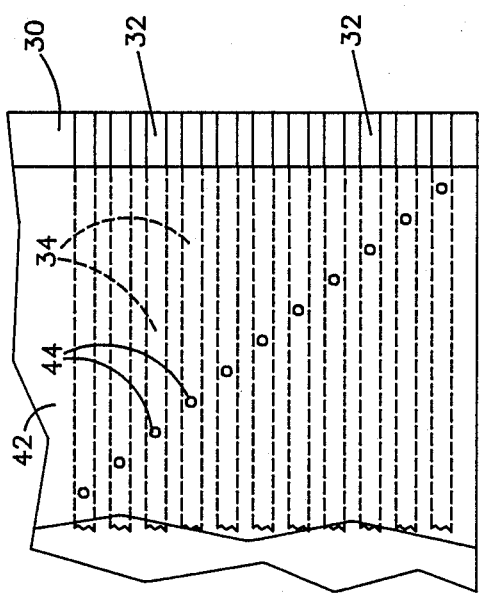
FIG. 13 is a top view of the printed circuit board of FIG. 8 in the process of creating an electrostatic printhead according to the method of the present invention after the step of applying an insulative coating containing holes or vias over the wires at points of intended connection.

As shown in FIG. 13, the next step in the preferred total method of manufacturing an electrostatic printhead with stylus/buss interconnects on the printed circuit board substrate is the addition of a layer of insulating material 42 over the portion of the substrate 30 and traces 34 to be traversed by the buss conductors. Holes or so-called "vias" 44 are disposed in the layer of insulating material 42 at points where the buss conductors (not yet shown) will cross the traces 34 and where, additionally, an electrical connection is to be affected between them. As depicted in FIG. 14, the vias 44 are plated, or the like, with a conductive material 46 employing any of the processes mentioned previously. Then, as depicted in FIG. 15, the conductive buss traces 48 are formed on the insulative material 42 in electrical contact with the conductive material 46. In actual practice, the formation of the conductive material in the vias 44 and the buss traces 48 will most likely take place as part of a single process. For convenience and completeness of disclosure only, they are described and shown separately herein.

Figure 16:
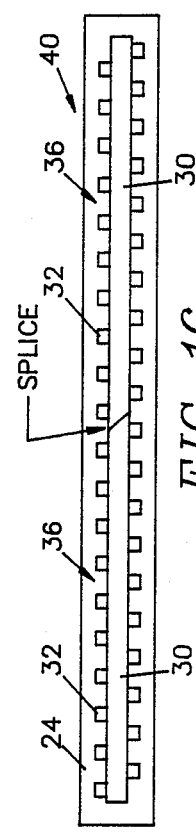
FIG. 16 is a simplified end view of an elongated electrostatic printhead manufactured according to the method of the present invention and depicting how multiple printhead sections created according to the techniques of FIGS. 8, 13–15 can be bonded together in an edge-to-edge relationship to form a unitary structure printhead of extended length.

The above-described method and manufacturing process of the present invention can be employed to make electrostatic printheads, and the like, of virtually unlimited size. The major constraint is process equipment and ultimate yield. Where large size (length) is required, it may be necessary (and desirable) to combine smaller size (length) printhead elements together into one combined printhead 40 as shown in FIG. 16. This latter approach requires accurately locating and finishing respective adjacent edges relative to the cross section adjacent styli (i.e., printwire nibs 32) in the final fabricated assembly. The splice point can be vertical or, as shown in the figure, at an angle. As also depicted in FIG. 16, the smaller size or fabricated large size (in length) assembly would be held more rigidly if potted or molded with an appropriate potting material 24, or the like, at an adequate thickness so as to provide easier and less critical handling.

Wherefore, having thus described my invention, what is claimed is:

1. The method of manufacturing an electrostatic printhead for a wide electrostatic plotter comprising the steps of:
   (a) forming a pattern of parallel, spaced, first printwire traces and connective conductors on one side of a first insulative substrate with ends of the first printwire traces terminating in a common plane defining a printface of a first printhead portion;
   (b) adding additional conductive material to the first printwire traces adjacent the common plane to give them a substantially square cross-section;
   (c) forming a pattern of parallel, spaced, second printwire traces and connective conductors on a second side of the first insulative substrate with ends of the second printwire traces terminating in the common plane defining the printface of the first printhead portion;
   (d) adding additional conductive material to the second printwire traces adjacent the common plane to give them a substantially square cross-section;
   (e) trimming the ends of the first and second printwire traces and the first substrate thereunder along a straight line adjacent the common plane to form the printface of the first printhead portion;
   (f) forming a pattern of parallel, spaced, third printwire traces and connective conductors on one side of a second insulative substrate with ends of the third printwire traces terminating in a common plane defining a printface of a second printhead portion;
   (g) adding additional conductive material to the third printwire traces adjacent the common plane to give them a substantially square cross-section;
   (h) forming a pattern of parallel, spaced, fourth printwire traces and connective conductors on a second side of the second insulative substrate with ends of the fourth printwire traces terminating in the common plane defining the printface of the second printhead portion;
   (i) adding additional conductive material to the fourth printwire traces adjacent the common plane to give them a substantially square cross-section;
   (j) trimming the ends of the third and fourth printwire traces and the second substrate thereunder along a straight line adjacent the common plane to form the printface of the second printhead portion;
   (k) positioning the first and second printhead portions side by side in a first common plane, with their printfaces in a second common plane and with their adjacent first, second, third, and fourth printwire traces registered with respect to one another;
   (l) bonding the first and second printhead portions together to form a single, lengthened, combined printhead; and,
   (m) encasing the combined printhead in a potting material with the printfaces of the first and second printhead portions exposed.

2. The method of manufacturing an elongated electrostatic printhead for a wide electrostatic plotter comprising the steps of:
   (a) forming a pair of printhead portions by, in each case, the steps of,
      (a1) forming a pattern of parallel, spaced, first printwire traces and connective conductors on one side of an insulative substrate with ends of the first printwire traces terminating in a common plane defining a printface of the printhead portion,
      (a2) adding additional conductive material to the first printwire traces adjacent the common plane to give them a substantially square cross-section,
      (a3) forming a pattern of parallel, spaced, second printwire traces and connective conductors on a second side of the insulative substrate with ends of the second printwire traces terminating in the common plane defining the printface of the printhead portion,
      (a4) adding additional conductive material to the second printwire traces adjacent the common plane to give them a substantially square cross-section, and
      (a5) trimming the ends of the first and second printwire traces and the substrate thereunder along a straight line adjacent the common plane to form the printface of the printhead portion;
   (b) positioning the pair of printhead portions side by side in a first common plane, with their printfaces in a second common plane and with their adjacent first and second printwire traces registered with respect to one another;
   (c) bonding the pair of printhead portions together to form the elongated electrostatic printhead; and,
   (d) encasing the elongated electrostatic printhead in a potting material with the printfaces of the pair of printhead portions exposed.

* * * * *